United States Patent
Korba et al.

(10) Patent No.: US 11,398,798 B2
(45) Date of Patent: Jul. 26, 2022

(54) DOHERTY POWER AMPLIFIERS WITH COUPLED LINE COMBINERS

(71) Applicant: Skyworks Solutions, Inc., Irvine, CA (US)

(72) Inventors: Brendan J. Korba, Ottawa (CA); John William Mitchell Rogers, Nepean (CA); Hassan Sarbishaei, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/249,328

(22) Filed: Feb. 26, 2021

(65) Prior Publication Data
US 2021/0273612 A1 Sep. 2, 2021

Related U.S. Application Data

(60) Provisional application No. 62/984,160, filed on Mar. 2, 2020.

(51) Int. Cl.
*H03F 1/02* (2006.01)
*H04B 1/38* (2015.01)
*H03F 3/24* (2006.01)

(52) U.S. Cl.
CPC .......... *H03F 1/0288* (2013.01); *H03F 3/245* (2013.01); *H04B 1/38* (2013.01); *H03F 2200/451* (2013.01)

(58) Field of Classification Search
CPC .. H03F 1/0288; H03F 3/245; H03F 2200/451; H04B 1/38
See application file for complete search history.

(56) References Cited

U.S. PATENT DOCUMENTS

| 6,731,172 B2 | 5/2004 | Thompson |
| 6,731,173 B1 | 5/2004 | Thompson |
| 6,917,246 B2 | 7/2005 | Thompson |

(Continued)

OTHER PUBLICATIONS

Chen et al., "A Ka-Band transformer-based doherty power amplifier for multi-Gb/s application in 90-nm CMOS", IEEE Microwave and Wireless Components Letters, vol. 28(12):1134-1136 (2018).

(Continued)

*Primary Examiner* — Nguyen T Vo
(74) *Attorney, Agent, or Firm* — Knobbe, Martens, Olson & Bear, LLP

(57) ABSTRACT

Doherty power amplifiers with coupled line combiners are provided herein. In certain embodiments, a power amplifier system includes a carrier amplifier having a carrier output that provides a first radio frequency signal, a peaking amplifier having a peaking output that provides a second radio frequency signal, and a coupled line combiner that combines the first radio frequency signal and the second radio frequency signal to generate a radio frequency output signal at an output terminal. The coupled line combiner includes a first conductor line connected between the peaking output and a reference voltage, a second conductor line electromagnetically coupled to the first conductor line, a third conductor line connected between the carrier output and the reference voltage, and a fourth conductor line electromagnetically coupled to the third conductor line and connected between the output terminal and the second conductor line.

20 Claims, 9 Drawing Sheets

(56) References Cited

U.S. PATENT DOCUMENTS

| | | |
|---|---|---|
| 8,508,296 B1 | 8/2013 | Mustafa et al. |
| 9,007,142 B1 | 4/2015 | Ozard |
| 9,071,211 B1 | 6/2015 | Ozard |
| 9,461,596 B1 | 10/2016 | Ozard |
| 9,467,115 B2 | 10/2016 | Lyalin |
| 9,685,918 B2 | 6/2017 | Li |
| 9,712,119 B2 | 7/2017 | Datta et al. |
| 9,742,365 B1 | 8/2017 | Ozard et al. |
| 9,774,300 B2 | 9/2017 | Jin et al. |
| 9,800,207 B2 | 10/2017 | Datta et al. |
| 9,806,681 B2 | 10/2017 | Lehtola |
| 9,838,056 B2 | 12/2017 | Wloczysiak |
| 9,912,299 B2 | 3/2018 | Lyalin |
| 9,923,523 B2 | 3/2018 | Lehtola |
| 10,009,054 B2 | 6/2018 | Wloczysiak |
| 10,164,669 B2 | 12/2018 | Cook et al. |
| 10,291,185 B2 | 5/2019 | Lyalin et al. |
| 10,305,437 B2 | 5/2019 | Ozard et al. |
| 10,320,333 B2 | 6/2019 | Li |
| 10,355,647 B2 | 7/2019 | Datta et al. |
| 10,447,322 B2 | 10/2019 | Wloczysiak |
| 10,483,918 B2 | 11/2019 | Jin et al. |
| 10,554,177 B2 | 2/2020 | Lyalin et al. |
| 10,560,055 B2 | 2/2020 | Li |
| 10,693,422 B2 | 6/2020 | Pan et al. |
| 10,756,677 B2 | 8/2020 | Lehtola |
| 10,778,152 B2 | 9/2020 | Lyalin et al. |
| 10,804,866 B2 | 10/2020 | Lehtola |
| 10,892,715 B2 | 1/2021 | Pan et al. |
| 10,972,055 B2 | 4/2021 | Naraine et al. |
| 2012/0126890 A1* | 5/2012 | Svechtarov ........... H03F 1/0288 330/124 R |
| 2016/0218693 A1* | 7/2016 | Lyalin .................... H03F 3/211 |
| 2019/0379339 A1 | 12/2019 | Ozard et al. |
| 2020/0014338 A1 | 1/2020 | Datta et al. |
| 2020/0136665 A1 | 4/2020 | Wloczysiak |
| 2020/0195200 A1* | 6/2020 | Wang ....................... H03F 1/56 |
| 2020/0350866 A1 | 11/2020 | Pehlke |
| 2020/0382070 A1 | 12/2020 | Lyalin et al. |
| 2022/0021344 A1* | 1/2022 | Maeda .................... H03F 1/565 |

OTHER PUBLICATIONS

Jensen et al., "Coupled transmission lines as impedance transformer", IEEE Transactions on Microwave Theory and Techniques, vol. 55(12):2957-2965 (2007).

Kaymaksut et al., "A 2.4 GHz fully integrated doherty power amplifier using seriss combining transformer", IEEE, ESAT-MICAS, Katholieke Universiteit Leuven, Leuven, Belgium, pp. 302-305 (2010).

Kaymaksut et al., "Analysis and design of series combining transformers for integrated doherty power amplifiers", Proceedings of Asia-Pacific Microwave Conference, pp. 1621-1624 (2010).

Nguyen et al., "A compact 29% PAE at 6 dB power back-off E-mode GaAs pHEMT MMIC doherty power amplifier at Ka-Band", IEEE, Dept. of Electrical and Computer Engineering, Univ. of California, Davis, pp. 1683-1686 (2017).

Nguyen et al., "A compact Ka-Band integrated doherty amplifier with reconfigurable input network", IEEE Transactions on Microwave Theory and Techniques, vol. 67(1):205-215 (2019).

Rostomyan et al., "28 GHz Doherty Power Amplifier in CMOS SOI with 28% Back-Off PAE", IEEE Microwave and Wireless Components Letters, vol. 28(5):446-448 (2018).

Wang et al., "A 28GHz/37GHz/39GHz Multiband Linear Doherty Power Amplifier for 5G Massive MIMO Applications", ISSCC 2017 / Sessions 2 / Power Amplifiers / 2.1, pp. 32-33.

Watanabe et al., "A broadband doherty power amplifier without a quarter-wave impedance inverting network", Proceedings of APMC, Kaohsiung, Taiwan, pp. 361-363 (2012).

* cited by examiner

DOHERTY POWER AMPLIFIERS WITH COUPLED LINE COMBINERS

CROSS-REFERENCE TO RELATED APPLICATIONS

This application claims the benefit of priority under 35 U.S.C. § 119 of U.S. Provisional Patent Application No. 62/984,160, filed Mar. 2, 2020 and titled "DOHERTY POWER AMPLIFIERS WITH COUPLED LINE COMBINERS," which is herein incorporated by reference in its entirety.

BACKGROUND

Technical Field

Embodiments of the invention relate to electronic systems, and in particular, to radio frequency (RF) electronics.

Description of Related Technology

Power amplifiers are used in RF communication systems to amplify RF signals for transmission via antennas.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 425 MHz to about 7.125 GHz for Frequency Range 1 (FR1) of the Fifth Generation (5G) communication standard or in the range of about 24.250 GHz to about 52.600 GHz for Frequency Range 2 (FR2) of the 5G communication standard.

SUMMARY

In certain embodiments, the present disclosure relates to a power amplifier system. The power amplifier system includes a carrier amplifier having a carrier output configured to provide a first radio frequency signal, a peaking amplifier having a peaking output configured to provide a second radio frequency signal, and a coupled line combiner configured to combine the first radio frequency signal and the second radio frequency signal to generate a radio frequency output signal at an output terminal. The coupled line combiner includes a first conductor line connected between the peaking output and a reference voltage, a second conductor line electromagnetically coupled to the first conductor line, a third conductor line connected between the carrier output and the reference voltage, and a fourth conductor line electromagnetically coupled to the third conductor line and connected between the output terminal and the second conductor line.

In some embodiments, the second conductor line includes a first end connected to the fourth conductor line and a second end that is electrically floating.

In various embodiments, the power amplifier system further includes a series inductor electrically connected between the fourth conductor line and the output terminal and a shunt capacitor in shunt to the series inductor, the series inductor and the shunt capacitor operable to provide an impedance transformation.

In a number of embodiments, the power amplifier system further includes a radio frequency splitter configured to split a radio frequency input signal into a first radio frequency input signal for the carrier amplifier and a second radio frequency input signal for the peaking amplifier.

In several embodiments, the reference voltage is ground.

In various embodiments, the power amplifier system is integrated in metallization of a semiconductor die.

In a number of embodiment, the radio frequency output signal has a frequency greater than 28 gigahertz.

In certain embodiments, the present disclosure relates to a mobile device includes a transceiver configured to generate a radio frequency input signal, and a front end system including a Doherty power amplifier configured to amplify the radio frequency input signal to generate a radio frequency output signal. The Doherty power amplifier includes a carrier amplifier having a carrier output configured to provide a first radio frequency signal, a peaking amplifier having a peaking output configured to provide a second radio frequency signal, and a coupled line combiner configured to combine the first radio frequency signal and the second radio frequency signal to generate the radio frequency output signal at an output terminal. The coupled line combiner includes a first conductor line connected between the peaking output and a reference voltage, a second conductor line electromagnetically coupled to the first conductor line, a third conductor line connected between the carrier output and the reference voltage, and a fourth conductor line electromagnetically coupled to the third conductor line and connected between the output terminal and the second conductor line.

In various embodiments, the second conductor line includes a first end connected to the fourth conductor line and a second end that is electrically floating.

In a number of embodiments, the Doherty amplifier further includes a series inductor electrically connected between the fourth conductor line and the output terminal and a shunt capacitor in shunt to the series inductor, the series inductor and the shunt capacitor operable to provide an impedance transformation.

In several embodiments, the Doherty amplifier further includes a radio frequency splitter configured to split the radio frequency input signal into a first radio frequency input signal for the carrier amplifier and a second radio frequency input signal for the peaking amplifier.

In some embodiments, the reference voltage is ground.

In various embodiments, the coupled line combiner is integrated in metallization of a semiconductor die.

In a number of embodiments, the radio frequency output signal has a frequency greater than 28 gigahertz.

In several embodiments, the mobile device further includes an antenna configured to transmit the radio frequency output signal.

In certain embodiments, the present disclosure relates to a method of radio frequency signal amplification in a mobile device. The method includes generating a radio frequency input signal using a transceiver, amplifying the radio frequency input signal using a carrier amplifier and a peaking amplifier of a Doherty power amplifier, and combining a carrier output of the carrier amplifier with a peaking output of the peaking amplifier using a coupled line combiner of the Doherty power amplifier, including providing electromagnetic coupling from a first conductor line between the peaking output and a reference voltage to a second conductor line, providing electromagnetic coupling from a third conductor line between the carrier output and the reference voltage to a fourth conductor line, and generating a radio frequency output signal using a series combination of the second conductor line and the fourth conductor line.

In a number of embodiments, the method further includes providing an impedance transformation using a series inductor in series with the second conductor line and the fourth conductor line, and a shunt inductor in shunt with the series inductor.

In various embodiment, the method further includes splitting the radio frequency input signal into a first radio frequency input signal for the carrier amplifier and a second radio frequency input signal for the peaking amplifier.

In several embodiments, the radio frequency output signal has a frequency greater than 28 gigahertz.

In a number of embodiments, the method further includes transmitting the radio frequency output signal using an antenna.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
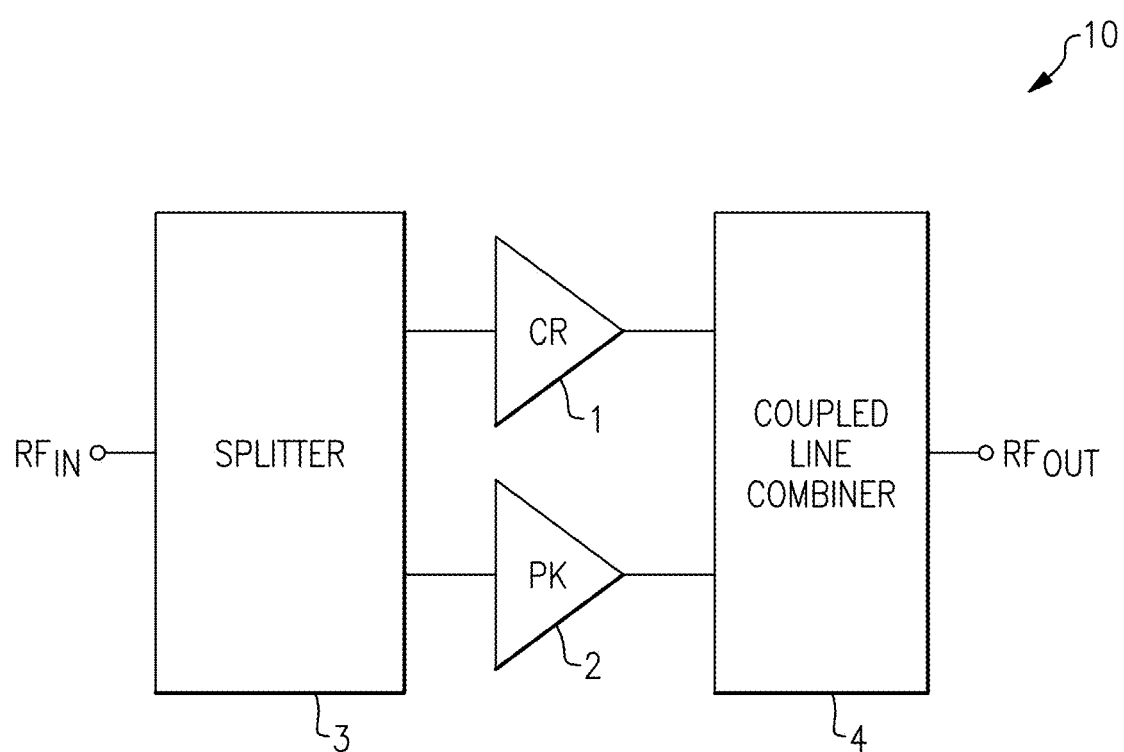
FIG. 1 is a schematic diagram of one embodiment of a Doherty power amplifier.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The linearity of a power amplifier is directly related to a level of gain compression within the power amplifier. Thus, a power amplifier can be designed for a fixed supply voltage that defines the target load impedance for acceptable linearity.

In certain applications, such as mobile handsets, operating environment leads to a relatively large variation in the load presented to a power amplifier. For example, a voltage standing wave ratio (VSWR) of an antenna and thus the power amplifier's load can vary based on a user's handling of the mobile handset. The load variation degrades power amplifier linearity and/or spectral performance.

One type of power amplifier is a Doherty power amplifier, which includes a main or carrier amplifier and an auxiliary or peaking amplifier that operate in combination with one another to amplify an RF signal. The Doherty power amplifier combines a carrier signal from the carrier amplifier and a peaking signal from the peaking amplifier to generate an amplified RF output signal. In certain implementations, the carrier amplifier is enabled over a wide range of power levels (for instance, by a class AB bias circuit) while the peaking amplifier is selectively enabled (for instance, by a class C bias circuit) at high power levels.

Doherty power amplifiers operate with high efficiency at 6 dB power back-off, but suffer from inefficiencies at lower power levels, for very high peak-to-average ratio (PAPR) waveforms, and/or when the output power is not well-centered at the peak of the amplifier's power-dependent efficiency profile. For example, advanced modulation schemes with high PAPR (for instance, 5G waveforms) require the amplifier to be operated several dB from the maximum saturated output power (Psat) to maintain linearity. Since even a small signal drive can lead a Doherty power amplifier to reach maximum saturated output power of its dynamic range, the backed-off power efficiency of a Doherty power amplifier is more important than its peak efficiency.

Moreover, the linearity of a Doherty power amplifier is particularly susceptible to degradation in the presence of load variation. For example, an amplitude distortion (AM/AM) of the carrier amplifier is a function of the load VSWR, while the AM/AM of the peaking amplifier is a function of input power, which is typically uncorrelated to the load VSWR.

A Doherty power amplifier includes a combiner for combining the output of the carrier amplifier and the output of the peaking amplifier. A combiner for a Doherty power amplifier is also referred to herein as a Doherty combiner.

Conventional Doherty combiners suffer from a number of drawbacks. In one example, a Doherty combiner is implemented using transmission lines that are large in size thus making the combiner difficult to implement on-chip. Moreover, a transmission line-based Doherty combiner using quarter length transmission lines can suffer from narrow band operation. In another example, a transformer-based Doherty combiner can suffer from high parasitics, low quality factor, and/or low self-resonant frequency that renders the combiner ill-suited for high frequency operation, such as for combining millimeter wave signals. Furthermore, off-chip solutions for load modulation are highly sensitive to parasitic effects and imbalances.

Doherty power amplifiers with coupled line combiners are provided herein. In certain embodiments, a power amplifier system includes a carrier amplifier having a carrier output that provides a first radio frequency signal, a peaking amplifier having a peaking output that provides a second radio frequency signal, and a coupled line combiner that combines the first radio frequency signal and the second radio frequency signal to generate a radio frequency output signal at an output terminal. The coupled line combiner includes a first conductor line connected between the peaking output and a reference voltage, a second conductor line electromagnetically coupled to the first conductor line, a third conductor line connected between the carrier output and the reference voltage, and a fourth conductor line electromagnetically coupled to the third conductor line and connected between the output terminal and the second conductor line.

By implementing the combiner in this manner, a number of advantages can be achieved, including, but not limited to, combining with high efficiency, broad bandwidth, high peak operating frequency (for instance, in the millimeter wave frequency range), low variation in impedance (for instance, imaginary impedance versus frequency), and/or on-chip integration.

The coupled lines are implemented with lengths, even-mode characteristic impedances, and odd-mode characteristic impedances to achieve desired operating parameters including, but not limited to, operating frequency, bandwidth, output impedance, and/or efficiency. Moreover, the lengths and characteristic impedances need not be the same for each pair of coupled lines, but rather can have different values for each pair to achieve desired operating characteristics and design constraints. In certain implementations, the coupled lines are formed from conductor lines each having less than a quarter wave length.

The coupled line combiner can serve to provide both power combining and an impedance transformation. To further aid in providing an impedance transformation and/or to compensate for parasitics, various output components can also be included at the combiner's output (load) terminal. For example, in certain implementations, a series inductor and a shunt capacitor are included at the combiner's output terminal.

The Doherty combiners disclosed herein can achieve a variety of performance results, which can depend on design implementation and manufacturing process. In one example, the combiner efficiency on its own (without a pre-match or post-match) is over 80% between 24 GHz and 31 GHz while providing an impedance transform from 33.2 Ohms to 16.15 Ohms (48%).

FIG. 1 is a schematic diagram of one embodiment of a Doherty power amplifier 10. The Doherty power amplifier 10 includes a carrier amplifier 1, a peaking amplifier 2, a splitter 3, and a coupled line combiner 4. Although one embodiment of a Doherty power amplifier is depicted, the teachings herein are applicable to Doherty power amplifiers implemented in other ways.

In the illustrated embodiment, the input splitter 3 splits an RF input signal $RF_{IN}$ into a first input signal component provided to the carrier amplifier 1 and a second input signal component provided to the peaking amplifier 2. In certain implementations, the first input signal component and the second input signal component have a phase difference or shift. For instance, in one example, the input splitter 3 is implemented using a 3 dB hybrid coupler that generates the first input signal component and the second input signal component with about equal power and a ninety degree phase shift. Although one example implementation of the input splitter 3 is described, other implementations are possible.

As shown in FIG. 1, the carrier amplifier 1 amplifies the first input signal component to generate a first amplified signal, and the peaking amplifier 2 amplifies the second input signal component to generate a second amplified signal. In certain implementations, the carrier amplifier 1 is maintained turned on over a wide signal power range, while the peaking amplifier 2 is turned off at low signal power and activated when the signal power reaches a threshold. In one example, the carrier amplifier 1 includes a class AB bias circuit for enabling the carrier amplifier 1 over a wide range of power levels, while the peaking amplifier 2 includes a class C bias circuit for enabling the peaking amplifier 2 at high power levels (and otherwise turning off the peaking amplifier 2).

The coupled line combiner 4 combines the first amplified signal from the carrier amplifier 1 and the second amplified signal from the peaking amplifier 2. The coupled line combiner 4 can be implemented in accordance with any of the embodiments herein.

Figure 2A:
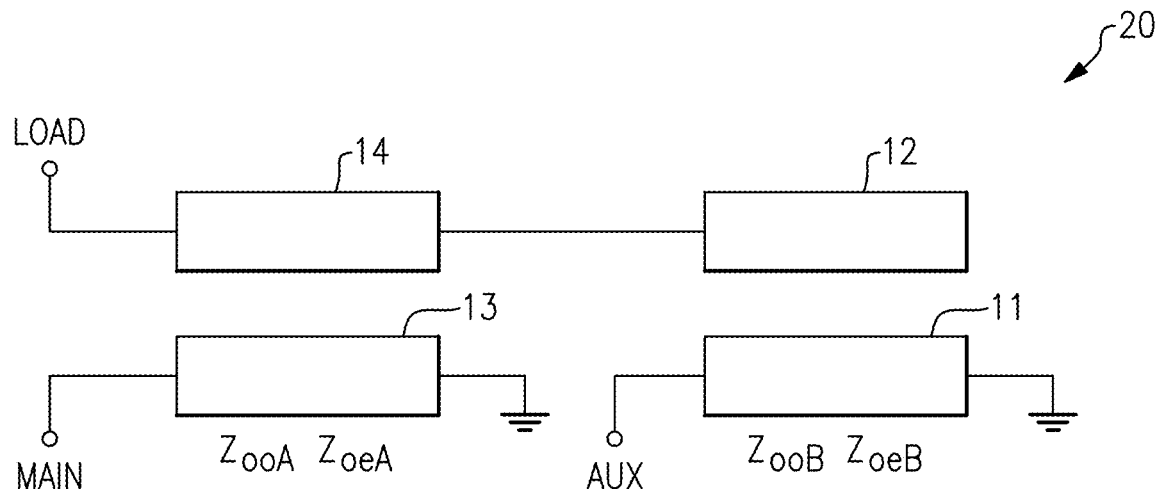
FIG. 2A is a schematic diagram of a coupled line combiner according to one embodiment.

FIG. 2A is a schematic diagram of a coupled line combiner 20 according to one embodiment. The coupled line combiner 20 includes a main terminal for connecting to an output of a main or carrier amplifier, an aux terminal for connecting to an output of an auxiliary or peaking amplifier, and a load terminal for connecting to a load, such as an antenna or an antenna access control circuit.

In the illustrated embodiment, the coupled line combiner 20 includes a first conductor line 11 connected between the aux terminal (the peaking amplifier output) and a reference voltage, a second conductor line 12 electromagnetically coupled to the first conductor line 11, a third conductor line 13 connected between the main terminal (the carrier amplifier output) and the reference voltage, and a fourth conductor line 14 electromagnetically coupled to the third conductor line 13 and connected between the load terminal and the second conductor line 12.

Accordingly, the coupled line combiner 20 includes two pairs of coupled lines arranged to combine RF signals provided on the main terminal and the aux terminal from a carrier amplifier and a peaking amplifier, respectively.

As shown in FIG. 2A, the conductor lines 11 and 12 are associated with a first coupled line section having an even-mode characteristic impedance $Z_{OEB}$ and an odd-mode characteristic impedance $Z_{OOB}$, and the conductor lines 13 and 14 are associated with a second coupled line section having an even-mode characteristic impedance $Z_{OEA}$ and an odd-mode characteristic impedance $Z_{OOA}$.

Figure 2B:
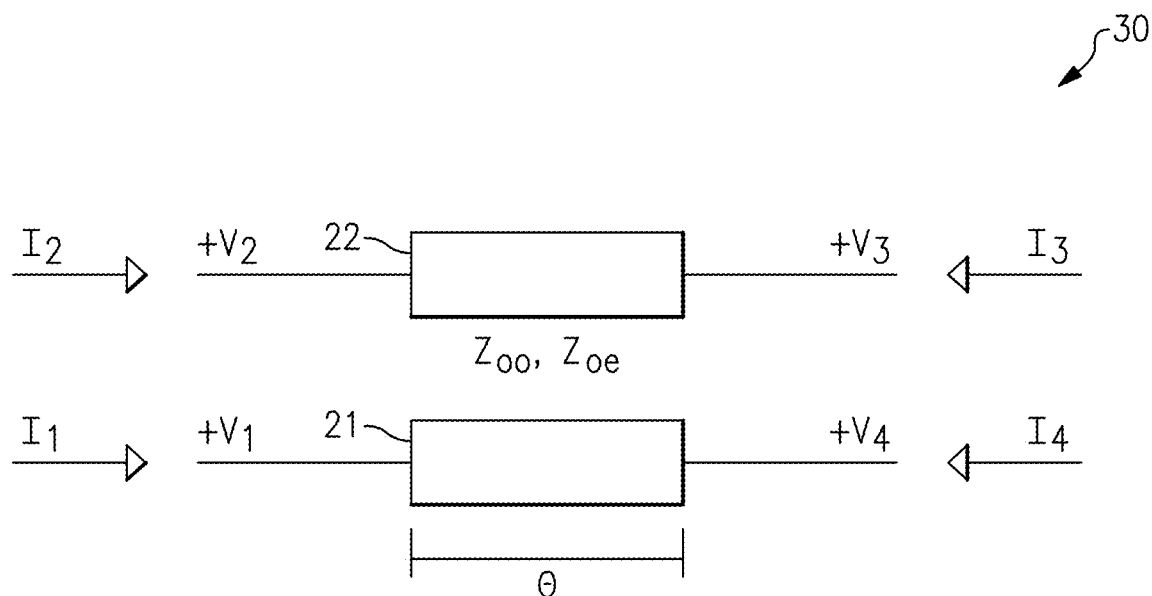
FIG. 2B is a schematic diagram of a coupled line section for a coupled line combiner according to one embodiment.

A generalized section 30 of coupled lines (conductor line 21 and conductor line 22) is depicted in FIG. 2B. The section 30 has been annotated to show voltages $V_1$, $V_2$, $V_3$, and $V_4$ and currents Ii, 12, 13, and 14, respectively, at a first port, a second port, a third port, and a fourth port of the section 30. Furthermore, the section 30 has been annotated with parameters for odd-mode characteristic impedance Zoo, even-mode characteristic impedance $Z_{OE}$, and electrical length θ in radians. One expression of an impedance matrix for the section 30 of FIG. 2B is given by Equation 1 below, where expressions for $Z_1$, $Z_2$, $Z_3$, and $Z_4$ are provided by Equations 2, 3, 4, and 5, respectively.

$$\begin{bmatrix} V_1 \\ V_2 \\ V_3 \\ V_4 \end{bmatrix} = \begin{bmatrix} Z_1 Z_2 Z_3 Z_4 \\ Z_2 Z_1 Z_4 Z_3 \\ Z_3 Z_4 Z_1 Z_2 \\ Z_4 Z_3 Z_2 Z_1 \end{bmatrix} \begin{bmatrix} I_1 \\ I_2 \\ I_3 \\ I_4 \end{bmatrix} \qquad \text{Equation 1}$$

$$Z_1 = \frac{-i}{2}(Z_{OE} + Z_{OO})\cot(\theta) \qquad \text{Equation 2}$$

-continued $$Z_2 = \frac{-i}{2}(Z_{OE} - Z_{OO})\cot(\theta) \quad \text{Equation 3}$$

$$Z_3 = \frac{-i}{2}(Z_{OE} - Z_{OO})\csc(\theta) \quad \text{Equation 4}$$

$$Z_4 = \frac{-i}{2}(Z_{OE} + Z_{OO})\csc(\theta) \quad \text{Equation 5}$$

With reference back to FIG. 2A, the matrix set forth in Equation 1 can be used to model the pair of coupled line sections associated with the coupled line combiner 20 of FIG. 2A. For the first section of coupled lines (conductor lines 11 and 12), the current $I_3$ is zero while $V_4$ is also zero since the fourth port is grounded. For the second section of coupled lines (conductor lines 13 and 14), the fourth port is grounded while the remaining ports are loaded. Equations 6 and 7 below provide simplified matrixes for these coupled line sections.

$$Z_A = \begin{bmatrix} Z_{1A} Z_{2A} Z_{3A} \\ Z_{2A} Z_{1A} Z_{4A} \\ Z_{3A} Z_{4A} Z_{1A} \end{bmatrix} \quad \text{Equation 6}$$

$$Z_B = \begin{bmatrix} Z_{1B} Z_{2B} \\ Z_{2B} Z_{1B} \end{bmatrix} \quad \text{Equation 7}$$

From Equations 6 and 7, the impedance presented to the carrier (main) amplifier $Z_{inC}$ as a function of the output load $Z_{load}$, the impedance of the auxiliary (peaking) amplifier $Z_{AUX}$, and the output impedance of the peaking amplifier $Z_{POUT}$ are given by Equation 8 and Equation 9 below.

$$Z_{inC} = \frac{\begin{vmatrix} Z_{1A} & Z_{2A} & Z_{3A} \\ Z_{2A} & Z_{1A} + Z_{load} & Z_{4A} \\ Z_{3A} & Z_{4A} & Z_{1A} + Z_{AUX} \end{vmatrix}}{\begin{vmatrix} 1 & Z_{2A} & Z_{3A} \\ 0 & Z_{1A} + Z_{load} & Z_{4A} \\ 0 & Z_{4A} & Z_{1A} + Z_{AUX} \end{vmatrix}} \quad \text{Equation 8}$$

$$Z_{1A} = Z_{Bin} = \frac{Z_{1B} - Z_{2B}Z_{2B}}{Z_{1B} + Z_{POUT}} \quad \text{Equation 9}$$

Figure 2C:
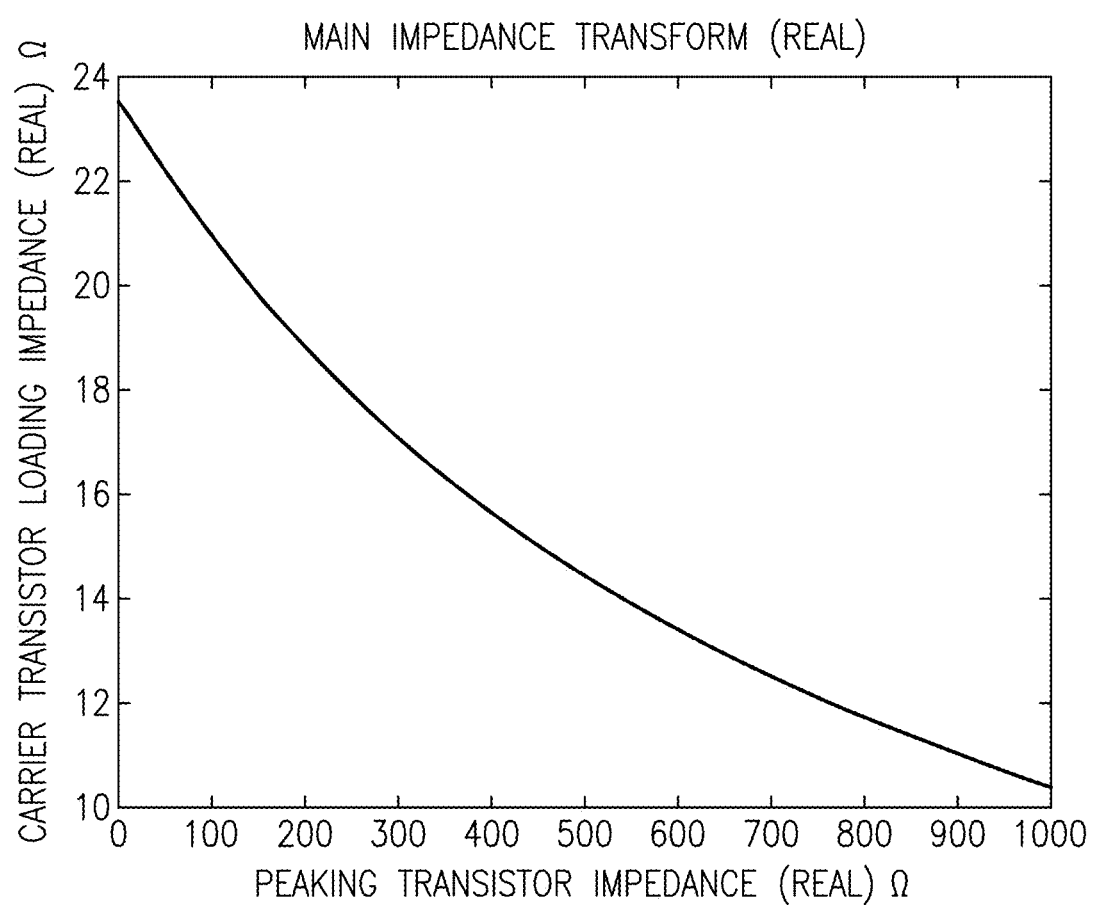
FIG. 2C is a graph of load modulation for a main amplifier in accordance with one implementation of the coupled line section of FIG. 2A.

FIG. 2C is a graph of load modulation for a main amplifier in accordance with one implementation of the coupled line section of FIG. 2A. In particular, the load modulation of the main amplifier is depicted as a function of output impedance of the peaking amplifier in accordance with the Equations discussed above.

Figure 2D:
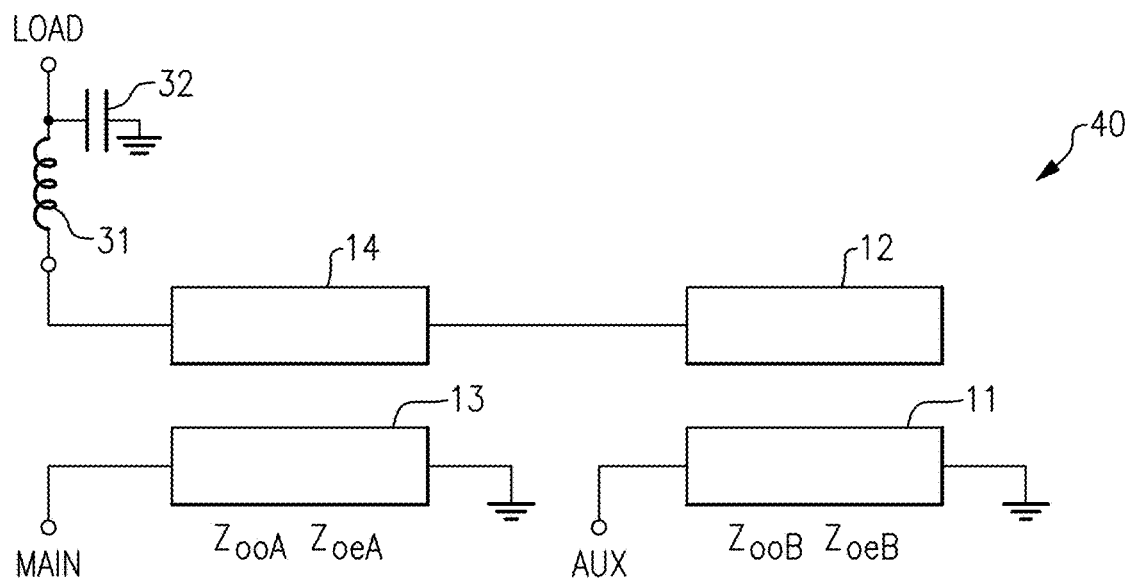
FIG. 2D is a schematic diagram of a coupled line combiner according to another embodiment.

FIG. 2D is a schematic diagram of a coupled line combiner 40 according to another embodiment.

The coupled line combiner 40 of FIG. 2D is similar to the coupled line combiner 20 of FIG. 2A, except that the coupled line combiner 40 of FIG. 2D further includes a series inductor 31 and a shunt capacitor 32. As shown in FIG. 2D, the series inductor 31 is connected between the load terminal and fourth conductor line 14, while the shunt capacitor 32 is connected between the load terminal and ground.

By including the series inductor 31 and the shunt capacitor 32, cancellation of parasitics and/or an output impedance match (for instance, to about 25 Ohms or other desired value) can be achieved.

Figure 3:
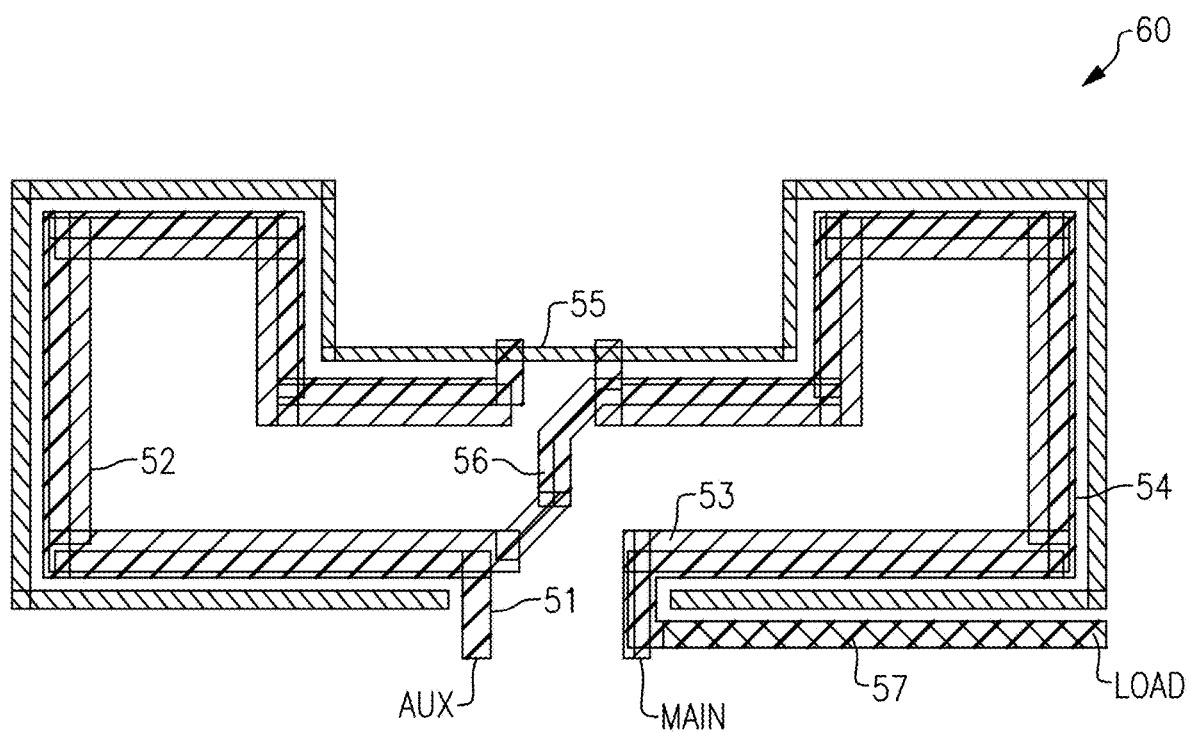
FIG. 3 is a chip metallization layout of a coupled line combiner according to one embodiment.

FIG. 3 is a chip metallization layout 60 of a coupled line combiner according to one embodiment. The chip metallization layout depicts a plan view of metal layers of a semiconductor die that implements the coupled line combiner. In this example, the semiconductor die is fabricated using a three metal layer process, for instance, a silicon on insulator (SOI) process with at least a semiconductor layer (for example, including transistors fabricated thereon), a first metal layer (M1) over the semiconductor layer, a second metal layer (M2) over M1, and third metal layer (M3) over M2.

In the illustrated embodiment, the chip metallization layout 60 includes a first conductor line 51 implemented on M2, a second conductor line 52 implemented on M1, a third conductor line 53 implemented on M1, and a fourth conductor line 54 implemented on M2. As shown in FIG. 3, the first conductor line 51 is connected between an aux port and a ground conductor 55, while the third conductor line 53 is connected between a main port and the ground conductor 55. Additionally, the second conductor line 52 is connected to the fourth conductor line 54 using an M1 to M2 connection 56 that includes vias. Furthermore, a series inductor 57 (implemented in M2, in this example) is connected between the load port and the fourth conductor line 54.

Although not shown in FIG. 3, a shunt capacitor can also be included between the load port and ground. For example, a metal-insulator-metal (MIM) structure can be used to implement the shunt capacitor.

The even-mode characteristic impedance, the odd-mode characteristic impedance, and the electrical length of the coupled lines can be achieved by selection of the layer(s) and geometry of the metal regions used for implementing the coupled line combiner. The values of one or more of these parameters can be the same as or different for one pair of coupled lines relative to the other pair of coupled lines.

The coupled lines depicted in FIG. 3 achieve electromagnetic coupling vertically from one metal layer to another metal layer. However, electromagnetic coupling can also be achieved horizontally using a pair of conductor lines formed in a common metal layer. Moreover, conductor lines can be electromagnetically coupled to one another on multiple levels of metallization, with vias providing interconnection between layers as needed.

In the illustrated embodiment, folding (for instance, ninety degree turns) is used on the conductor lines as shown to achieve a compact layout.

Figure 4A:
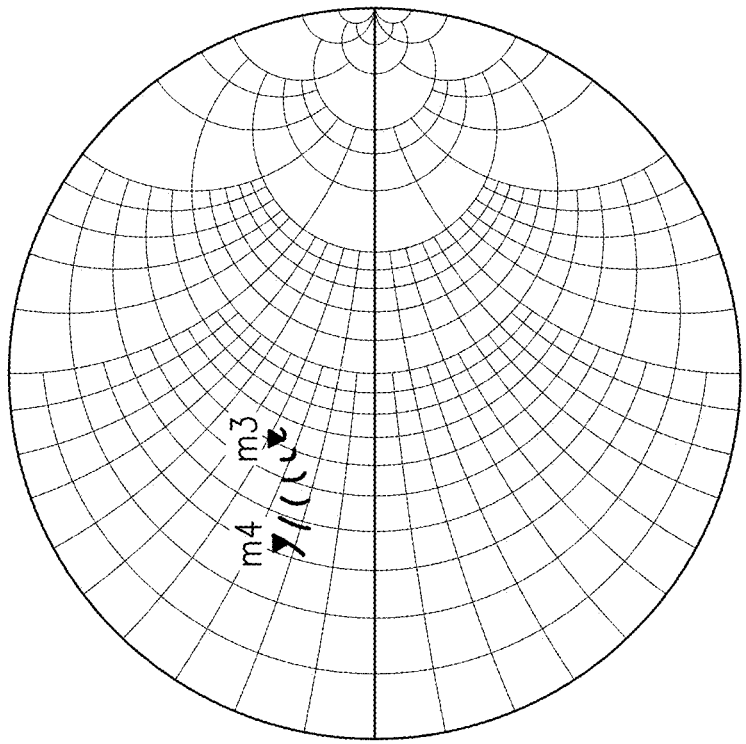
FIG. 4A depicts Smith charts for two examples of Doherty combiners.
Figure 4A:
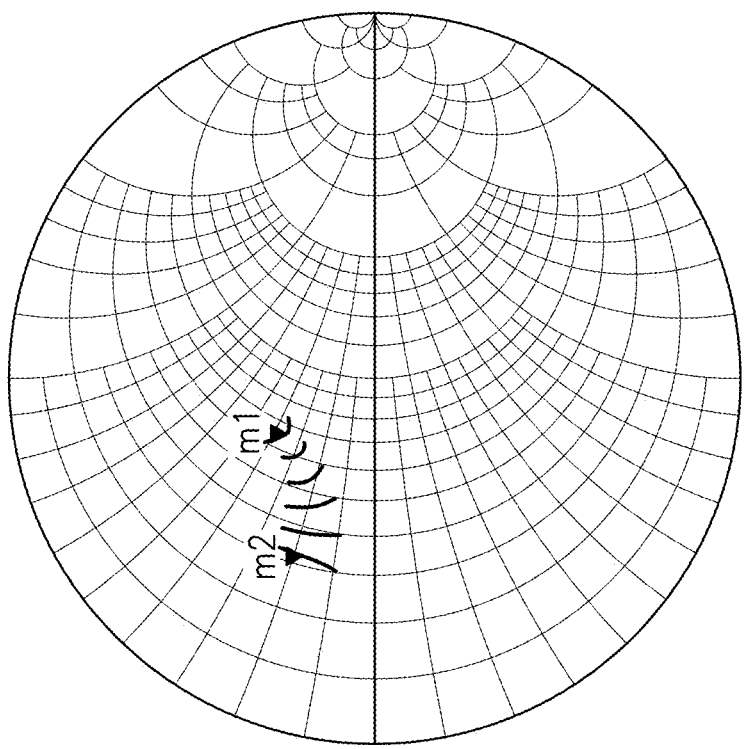

FIG. 4A depicts Smith charts for two examples of Doherty combiners. The graph depicts a first Smith chart (pictured at left) for a Doherty power amplifier using one implementation of a coupled line combiner. The first Smith chart includes a measurement m1 at low input power and a measurement m2 at high input power. The Smith chart depicts impedance trajectories at frequencies ranging between 24 GHz and 31 GHz.

The graph also depicts a second Smith chart (pictured at right) for a Doherty power amplifier using a discrete coupled line model. The second Smith chart includes a measurement m3 at low input power and a measurement m4 at high input power.

As shown in FIG. 4A, excellent load modulation is achieved for the depicted combiner structures. Furthermore, high frequency performance over a wide bandwidth is realized.

Figure 4B:
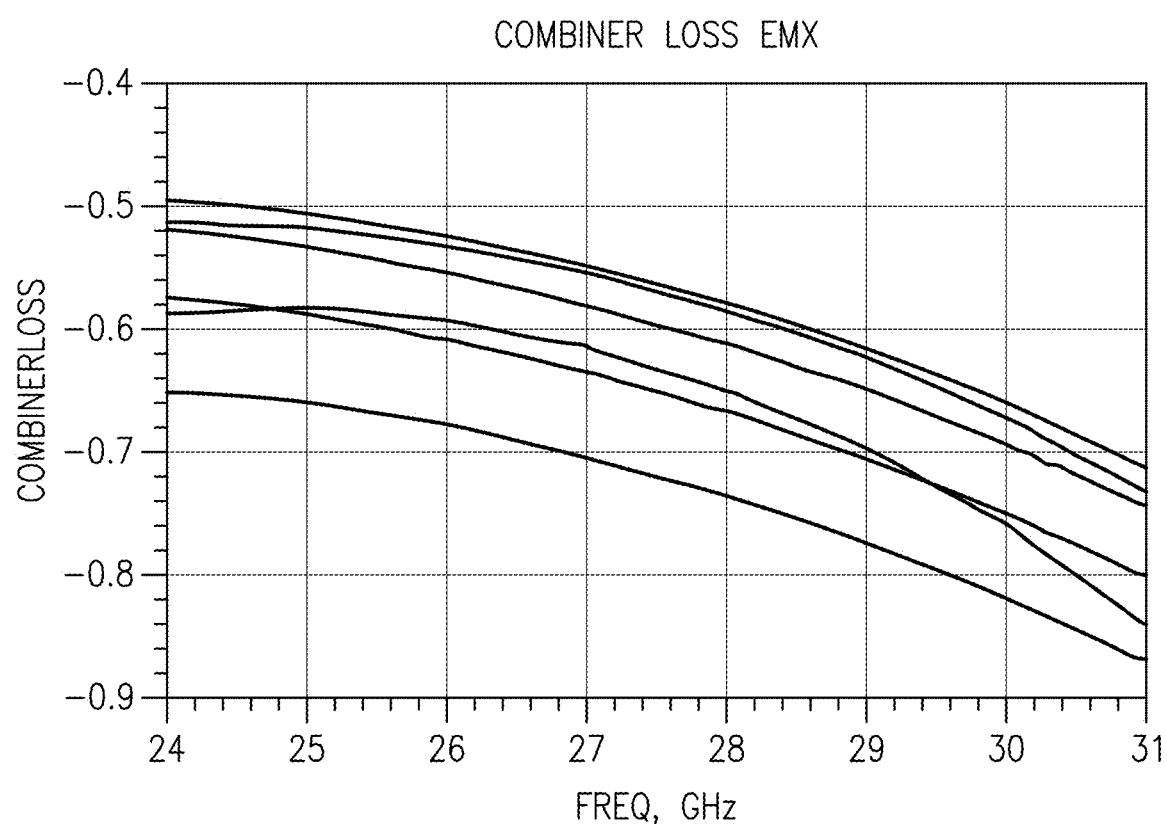
FIG. 4B is a graph of loss versus frequency for one implementation of a coupled line combiner.

FIG. 4B is a graph of loss versus frequency for one implementation of a coupled line combiner. In this example, at 28 GHz the coupled line combiner provides a 25% marginal bandwidth with a 77.6% efficiency. Thus, low loss, high frequency operation, and wide marginal bandwidth is achieved.

Figure 5:
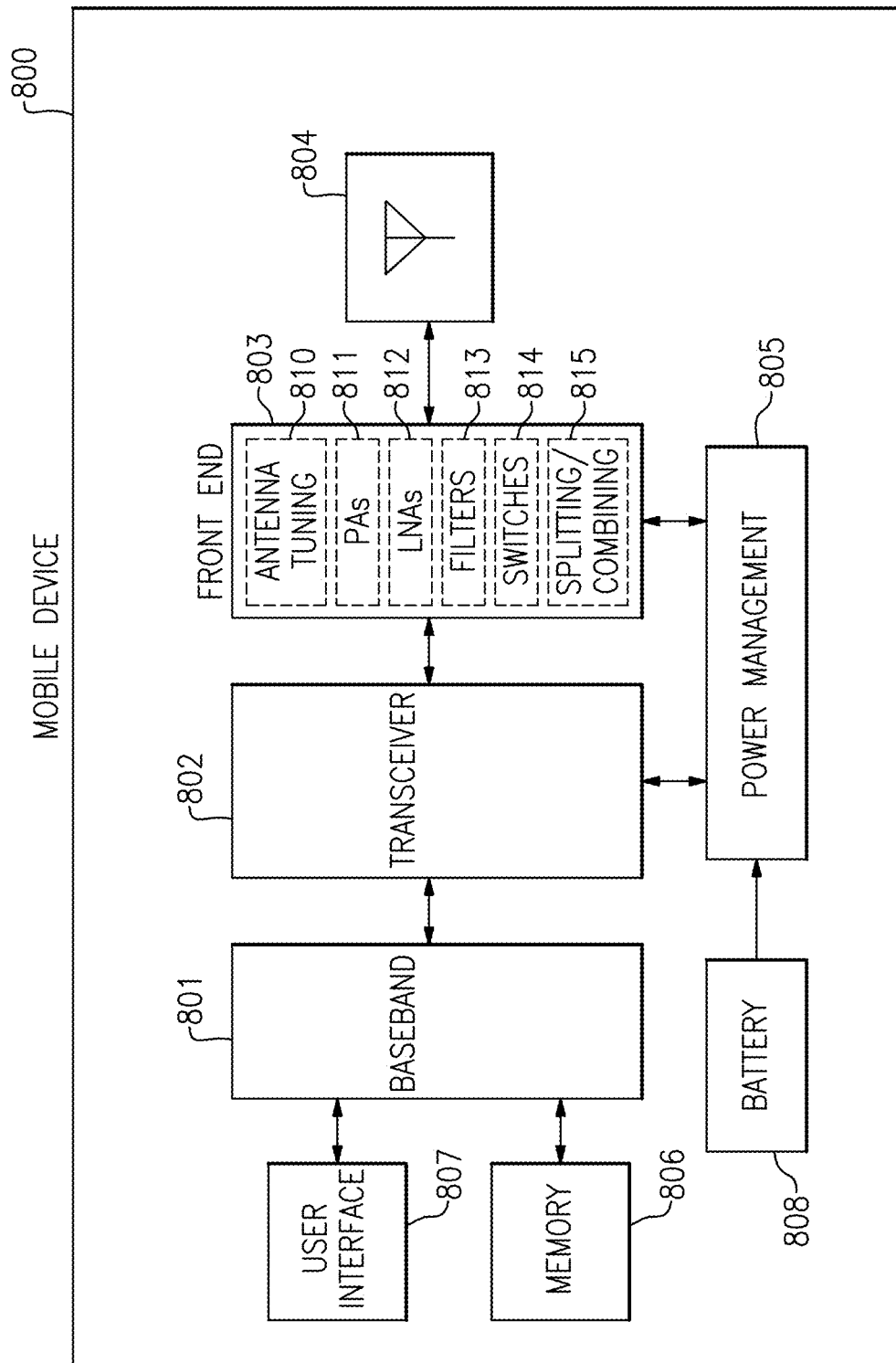
FIG. 5 is a schematic diagram of one embodiment of a mobile device.

FIG. 5 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 5 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible. The front end system 803 can include one or more coupled line Doherty power amplifiers implemented in accordance with the teachings herein.

Thus, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is connected to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 5, the baseband system 801 is connected to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 5, the power management system 805 receives a battery voltage from the battery 808. The battery 808 can be any suitable battery for use in the mobile device 800, including, for example, a lithium-ion battery.

Figure 6:
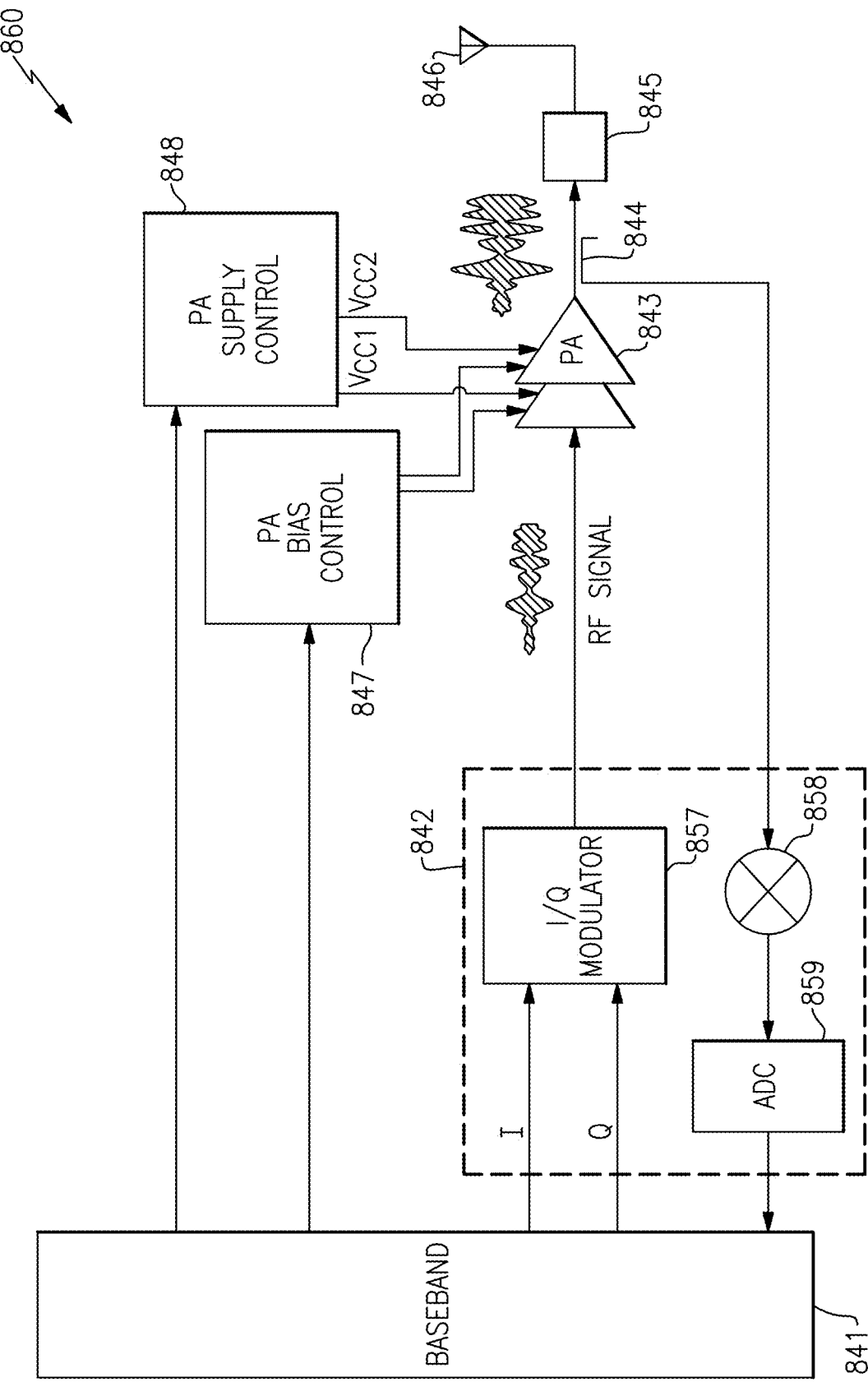
FIG. 6 is a schematic diagram of a power amplifier system according to one embodiment.

FIG. 6 is a schematic diagram of a power amplifier system 860 according to one embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845. The power amplifier 843 can be implemented with one or more features of the present disclosure.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 6, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Figure 7A:
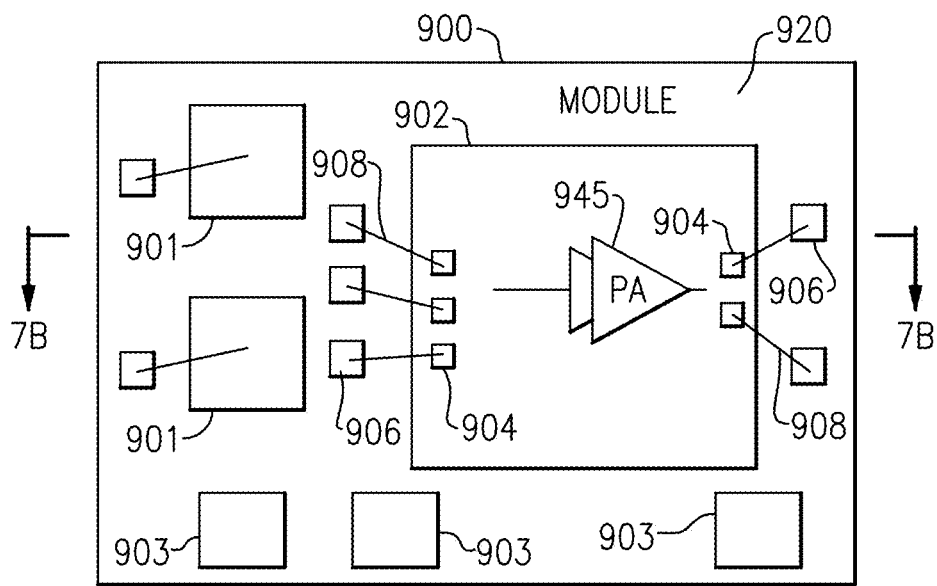
FIG. 7A is a schematic diagram of one embodiment of a packaged module.
Figure 7B:
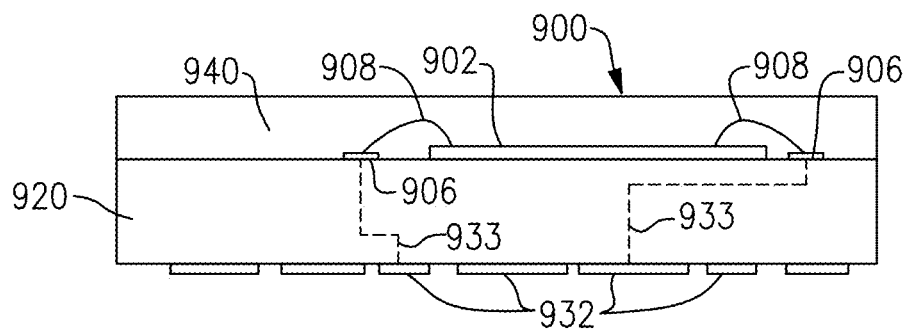
FIG. 7B is a schematic diagram of a cross-section of the packaged module of FIG. 7A taken along the lines 7B-7B.

FIG. 7A is a schematic diagram of one embodiment of a packaged module 900. FIG. 7B is a schematic diagram of a cross-section of the packaged module 900 of FIG. 7A taken along the lines 7B-7B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a power amplifier 945, which can be implemented in accordance with one or more features disclosed herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 7B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 7B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Applications

The principles and advantages of the embodiments herein can be used for any other systems or apparatus that have needs for RF combining. Examples of such apparatus include RF communication systems. RF communications systems include, but are not limited to, mobile phones, tablets, base stations, network access points, customer-premises equipment (CPE), laptops, and wearable electronics. Thus, the RF combiners herein can be included in various electronic devices, including, but not limited to, consumer electronic products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
a carrier amplifier having a carrier output configured to provide a first radio frequency signal;
a peaking amplifier having a peaking output configured to provide a second radio frequency signal; and
a coupled line combiner configured to combine the first radio frequency signal and the second radio frequency signal to generate a radio frequency output signal at an output terminal, the coupled line combiner including a first conductor line connected between the peaking output and a reference voltage, a second conductor line electromagnetically coupled to the first conductor line, a third conductor line connected between the carrier output and the reference voltage, and a fourth conductor line electromagnetically coupled to the third conductor line and connected between the output terminal and the second conductor line.

2. The power amplifier system of claim 1 wherein the second conductor line includes a first end connected to the fourth conductor line and a second end that is electrically floating.

3. The power amplifier system of claim 1 further comprising a series inductor electrically connected between the fourth conductor line and the output terminal and a shunt capacitor in shunt to the series inductor, the series inductor and the shunt capacitor operable to provide an impedance transformation.

4. The power amplifier system of claim 1 further comprising a radio frequency splitter configured to split a radio frequency input signal into a first radio frequency input signal for the carrier amplifier and a second radio frequency input signal for the peaking amplifier.

5. The power amplifier system of claim 1 wherein the reference voltage is ground.

6. The power amplifier system of claim 1 integrated in metallization of a semiconductor die.

7. The power amplifier system of claim 1 wherein the radio frequency output signal has a frequency greater than 28 gigahertz.

8. A mobile device comprising:
a transceiver configured to generate a radio frequency input signal; and
a front end system including a Doherty power amplifier configured to amplify the radio frequency input signal to generate a radio frequency output signal, the Doherty power amplifier including a carrier amplifier having a carrier output configured to provide a first radio frequency signal, a peaking amplifier having a peaking output configured to provide a second radio frequency signal, and a coupled line combiner configured to combine the first radio frequency signal and the second radio frequency signal to generate the radio frequency output signal at an output terminal, the coupled line combiner including a first conductor line connected between the peaking output and a reference voltage, a second conductor line electromagnetically coupled to the first conductor line, a third conductor line connected between the carrier output and the reference voltage, and a fourth conductor line electromagnetically coupled to the third conductor line and connected between the output terminal and the second conductor line.

9. The mobile device of claim 8 wherein the second conductor line includes a first end connected to the fourth conductor line and a second end that is electrically floating.

10. The mobile device of claim 8 wherein the Doherty amplifier further includes a series inductor electrically connected between the fourth conductor line and the output terminal and a shunt capacitor in shunt to the series inductor, the series inductor and the shunt capacitor operable to provide an impedance transformation.

11. The mobile device of claim 8 wherein the Doherty amplifier further includes a radio frequency splitter configured to split the radio frequency input signal into a first radio frequency input signal for the carrier amplifier and a second radio frequency input signal for the peaking amplifier.

12. The mobile device of claim 8 wherein the reference voltage is ground.

13. The mobile device of claim 8 wherein the coupled line combiner is integrated in metallization of a semiconductor die.

14. The mobile device of claim 8 wherein the radio frequency output signal has a frequency greater than 28 gigahertz.

15. The mobile device of claim 8 further comprising an antenna configured to transmit the radio frequency output signal.

16. A method of radio frequency signal amplification in a mobile device, the method comprising:
generating a radio frequency input signal using a transceiver;
amplifying the radio frequency input signal using a carrier amplifier and a peaking amplifier of a Doherty power amplifier; and
combining a carrier output of the carrier amplifier with a peaking output of the peaking amplifier using a coupled line combiner of the Doherty power amplifier, including providing electromagnetic coupling from a first conductor line between the peaking output and a reference voltage to a second conductor line, providing electromagnetic coupling from a third conductor line between the carrier output and the reference voltage to a fourth conductor line, and generating a radio frequency output signal using a series combination of the second conductor line and the fourth conductor line.

17. The method of claim 16 further comprising providing an impedance transformation using a series inductor in series with the second conductor line and the fourth conductor line, and a shunt inductor in shunt with the series inductor.

18. The method of claim 16 further comprising splitting the radio frequency input signal into a first radio frequency input signal for the carrier amplifier and a second radio frequency input signal for the peaking amplifier.

19. The method of claim 16 wherein the radio frequency output signal has a frequency greater than 28 gigahertz.

20. The method of claim 16 further comprising transmitting the radio frequency output signal using an antenna.

* * * * *